United States Patent [19]
Barthelemy

[11] Patent Number: 5,692,286
[45] Date of Patent: Dec. 2, 1997

[54] METHOD FOR SHAPING PARTS IN ONE OR MORE STACKED BOARD SHAPED ELEMENTS AND MACHINE TOOL FOR IMPLEMENTING THIS METHOD

[75] Inventor: Patrice Barthelemy, Les Geneveys-sur-Coffrane, Switzerland

[73] Assignee: Posulax S.A., Bienne, Switzerland

[21] Appl. No.: 537,359

[22] Filed: Oct. 2, 1995

[51] Int. Cl.[6] ............................................. B23P 17/00
[52] U.S. Cl. .................... 29/423; 29/412; 29/825; 269/47; 269/53; 409/225
[58] Field of Search ..................... 29/412, 418, 423, 29/825, 846, 848; 269/47, 53; 409/225, 903; 408/1 R, 84

[56] References Cited

U.S. PATENT DOCUMENTS

| | | | |
|---|---|---|---|
| 2,576,786 | 11/1951 | Gray et al. | 408/84 |
| 3,015,240 | 1/1962 | Hodnett | 408/84 |
| 3,942,780 | 3/1976 | Clement | 269/47 |
| 4,801,225 | 1/1989 | Morghen | 269/47 X |
| 4,964,766 | 10/1990 | Turchan et al. | 269/47 X |

Primary Examiner—S. Thomas Hughes
Attorney, Agent, or Firm—Griffin, Butler, Whisenhunt & Kurtossy

[57] ABSTRACT

A method of shaping printed circuit boards comprises the steps of providing a base plate, installing a board shaped element including the parts to be shaped on an upper surface of the base plate, fixing the base plate and board shaped element on a table of a machine tool with a lower surface of the base plate in contact with the table, drilling a hole through the board shaped element within the contour of each part to be shaped, the hole extending substantially as far as the lower surface, installing a pin in the hole, carrying out the shaping of the parts, and, machining the pin to partially or completely remove the pin.

17 Claims, 3 Drawing Sheets

METHOD FOR SHAPING PARTS IN ONE OR MORE STACKED BOARD SHAPED ELEMENTS AND MACHINE TOOL FOR IMPLEMENTING THIS METHOD

FIELD OF THE INVENTION

The invention concerns a method for shaping parts in one or more board shaped elements.

More particularly, the invention relates to a method for shaping a plurality of printed circuit substrates, notably by milling a board or a stack of boards of printed circuits in order to separate the printed circuit substrates from each other.

The invention also concerns a machine tool in particular for implementing this method and more particularly, a machine tool of this type capable of automatically carrying out drilling, shaping, milling, pinning and other operations.

BACKGROUND OF THE INVENTION

Printed circuits are generally produced in batches of identical circuits on standardized board shaped elements of relatively large dimensions. After the different operations necessary for the production of printed circuits, such as the deposit of conductive paths, drilling etc., have been implemented, the individual printed circuits are separated from each other during a shaping operation. This shaping operation consists of milling the board shaped element or elements along the contour of each printed circuit, then separating them from the skeleton.

During this shaping or milling operation, there is a risk that if the printed circuit is not held in an appropriate manner, it will leave its position in the board shaped element and disturb the rest of the shaping cycle of the other printed circuits. The stress imposed by the shaping tool in the last millimeters of milling on the printed circuit, which is secured at this point only by a small bridge of material connecting it to the board shaped element, may cause an untimely rupture of the bridge before the printed board is completely shaped. A further consequence of this is that printed circuits with an irregularity or overlap on their periphery are provided which gives the finished circuit a poor appearance.

Two solutions are currently used to overcome this problem.

One solution consists of placing a board shaped element comprising the printed circuits to be shaped on a plate attached to the machine by conventional means, said plate comprising a device for holding the board shaped element in place via a vacuum. This solution has the disadvantage of enabling only one element at a time to be received on the vacuum plate and consequently of having a poor yield. Further, it is also necessary to use dedicated plates for each batch of given printed circuits.

Another solution, illustrated by FIG. 1, consists of fixing on table 1 of a machine tool, a support plate 2, on which is arranged a stack 5 of several board shaped elements 3, each element bearing several printed circuits 6 required to be shaped along contour 7. Pins 9 are permanently driven into support plate 2. Board shaped elements 3 are arranged on said plate, dedicated to one batch of determined printed circuits, each printed circuit being provided with at least one hole into which one of pins 9 is driven. The printed circuits are thus fixedly held during shaping operations, by the pins which are driven into the board shaped elements on support plate 2. Support plate 2 and stack 5 are attached to table 1 of the machine tool by any appropriate means, for example by means of through pins 11.

This solution has a number of disadvantages. The installation of the board shaped elements on the support plate and the removal of the pins from the shaped printed circuits are long and fastidious operations and require the machine carrying out the shaping to be stopped, which immobilizes costly production tools for long periods. Further, these installation and pin removal operations require the intervention of a significant number of operators. Immobilizing the machine, during these installation and pin removal operations, requires a significant number of machines to carry out a given job. In addition, for production batches which are spaced out in time, the fact that each support plate is dedicated to a particular printed circuit poses problems as regards controlling a significant stock of support plates and notably problems of stocking and supplying the plates to the right machines at the right time. These disadvantages mean that automation of the method is virtually impossible.

SUMMARY OF THE INVENTION

A principal object of the invention is thus to overcome the aforementioned disadvantages of the prior art by providing a method for shaping parts in a board shaped element or several of these elements forming a stack and in particular printed circuit boards. The method according to the invention notably enables a break away from the use of pin support plates, and thereby from the problems of controlling these plates, which eventually contributes to a reduction in the cost and time of shaping operations, while maintaining the printed circuits in a satisfactory position during such shaping.

Another object of the invention is to provide a machine tool notably for implementing this method, this machine being capable of carrying out the machining operations associated with the shaping of printed circuits with maximum speed and efficiency.

The invention thus concerns a method for shaping parts in one or more board shaped elements stacked on the table of a machine tool and in particular printed circuit boards, characterized in that it includes the steps of:

providing a base plate comprising an upper face and a lower face, installing on said upper surface of the base plate at least one board shaped element including the parts to be shaped, fixing said base plate and said board shaped element onto the table of the machine tool so that said lower face of the base plate comes into contact with said table, drilling through said board shaped element inside the contour of each part to be shaped at least one hole extending substantially as far as the lower face of said base plate, installing pinning means in said hole, carrying out the shaping of said part, removing partially or completely said pinning means by machining the latter.

This method thus enables one to eliminate the pin removal operations which necessitate unloading the machine on which the board shaped elements comprising the parts which have just been shaped are situated and loading said elements onto a machine for removing pins from parts or if necessary manual pin removal, and consequently to eliminate the work stations and the operators of such work stations. One also eliminates in accordance with this method the problems of control and logistics associated with the use of base boards comprising driven in pins which vary according to a distribution which is dedicated to batches of particular printed circuits. This method is thus of very general application since it enables any parts to be shaped without having to prepare dedicated base boards. The preparation and loading of the board shaped elements are also facilitated, which enables these operations to be easily automated. The separation of the shaped parts from the skeleton is similarly facilitated.

The invention also concerns a machine tool in particular for implementing the shaping method according to the invention, comprising a frame, at least one workpiece carrier, at least one operating unit driving a rotatable cutting tool, means enabling relative displacement of the workpiece carrier and the operating unit in at least two directions, characterized in that it further comprises at least one pinning unit arranged to install or to form a pin in a part fixed onto said workpiece carrier, said machine comprising in addition means enabling relative displacement of the work-piece carrier and the pinning unit in at least two directions.

BRIEF DESCRIPTION OF THE DRAWINGS

Other advantages and characteristics of the invention will appear upon reading the detailed description which follows of an embodiment example given by way of illustrative and non limiting example in conjunction with the attached drawings in which.

DESCRIPTION OF PREFERRED EMBODIMENT

Figure 2:
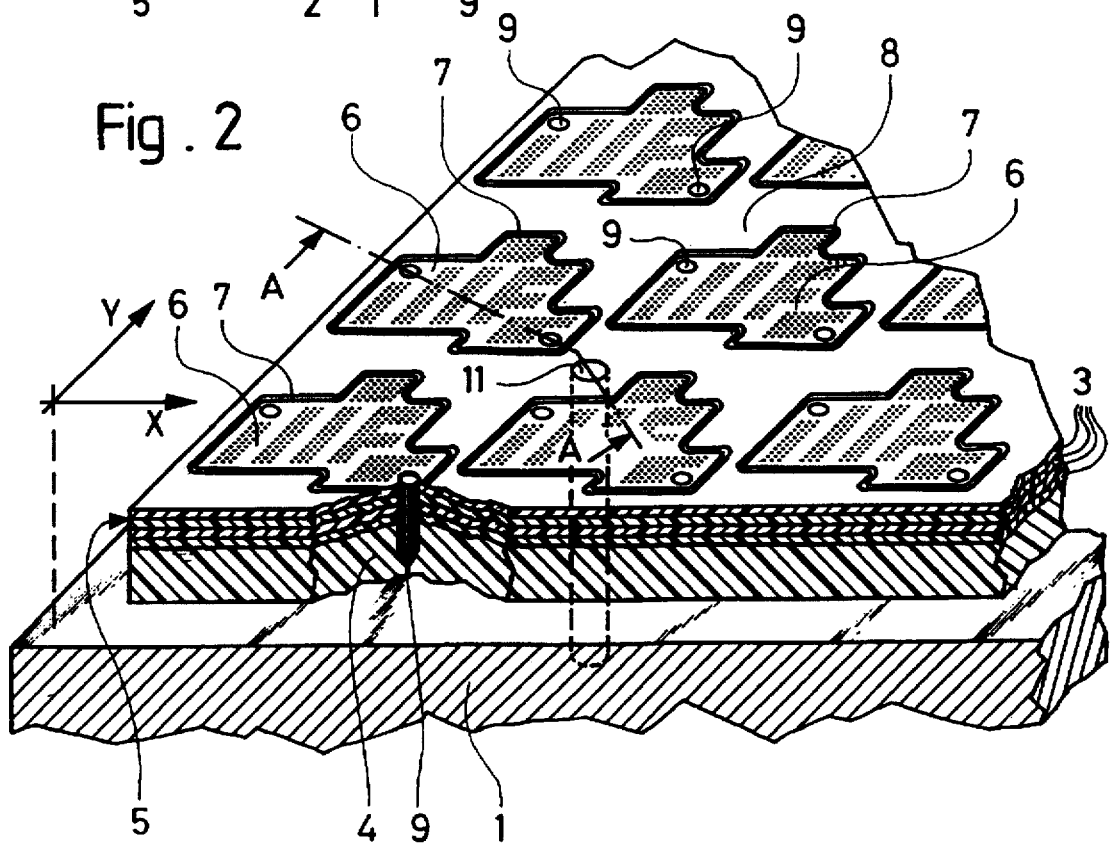
FIG. 2 is a partially cut away perspective view of a part of a stack of board shaped elements at a step of the method according to the invention found just at the end of the shaping operation.
Figure 3:
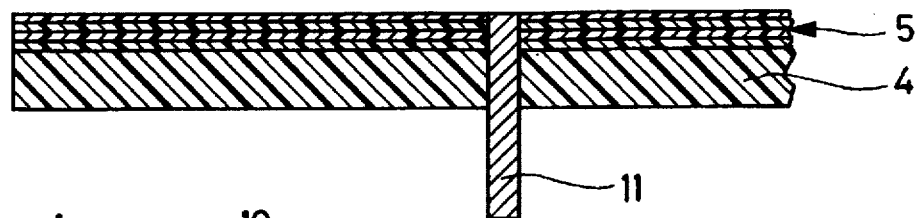
FIGS. 3 to 7 show respectively, along the cross-section A—A, a stack of board shaped elements at different steps of the method according to the invention.
Figure 4:
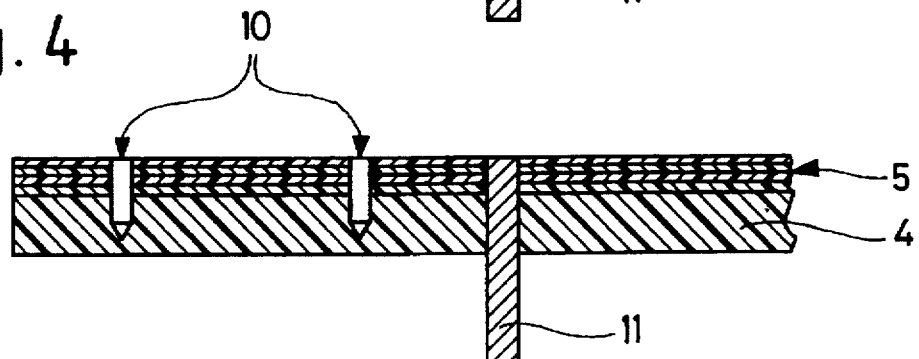
Figure 5:
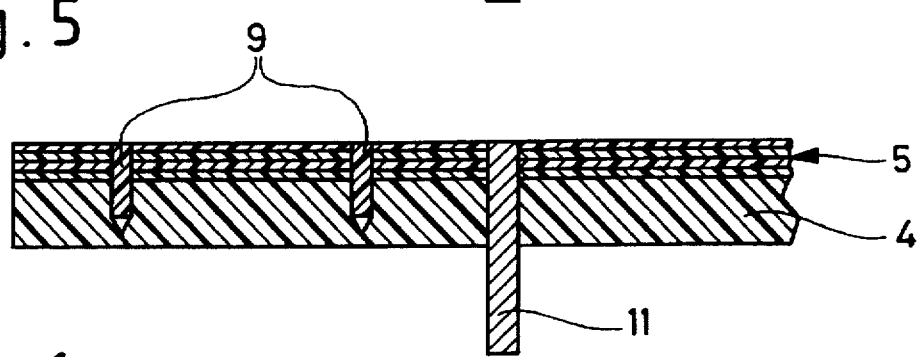
Figure 6:
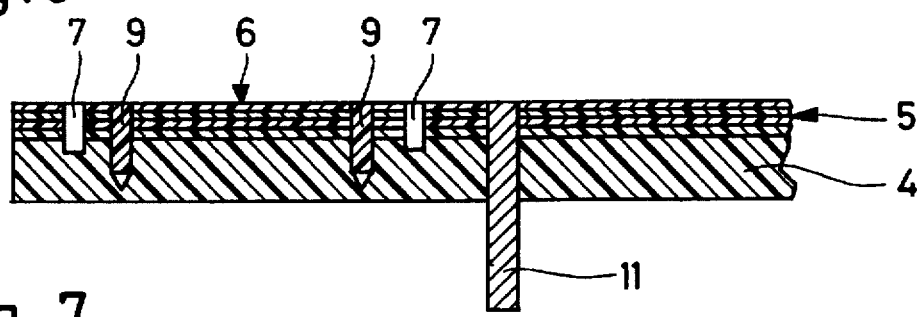
Figure 7:
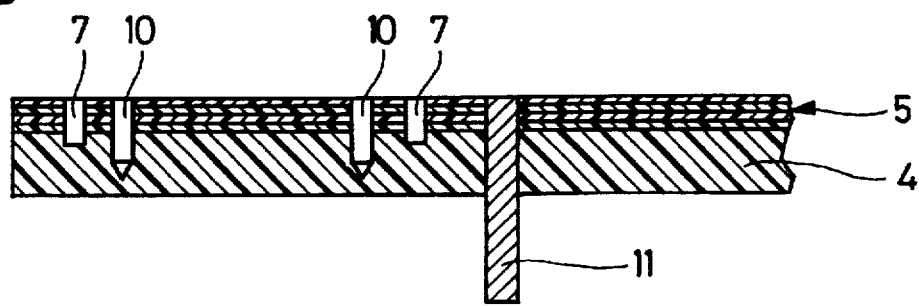

Referring first to FIG. 2, a table 1 is shown mounted on a machine tool so as to be able to move in two perpendicular directions represented by axes X, Y. On table 1 a stack 5 of identical board shaped elements 3 is arranged, said elements comprising parts 6 to be shaped along a contour 7, so as to leave at the end of the operation only a skeleton 8. Each standard board shaped element of relatively large dimensions (for example 18" by 24") may comprise a large number of parts 6, for example 20 to 30 printed circuits. Likewise, the number of board shaped elements, whose thickness is generally between 1 and 2 mm, may form a stack whose total thickness is limited only by the depth of the cut able to be made by the cutting tool. Thus, it will be possible to obtain in a single machining operation up to a hundred separate parts, or even more.

Stack 5 of board shaped elements 3 rests on the upper face of a base plate 4 abutting table 1 with its lower face, having the same surface area as the board shaped elements and realized in a rigid but inexpensive material, such as an agglomerate of resin and paper or wood (marketed for example under the name Dellite®) or a plywood of around 3 mm. The assembly formed by stack 5 and base plate 4 is held in place on table 1 by any appropriate means known to the prior art. In the example described, this attachment is achieved by means of through pins 11, attached to table 1 and passing through said assembly as far as a part of skeleton 8 of the outermost board shaped element. This attachment could also be achieved by means of stirrups attached to table 1 and supported by the edges of stack 5.

In the cut away part, one can distinguish a pin 9 one end of which is flush with the outermost board shaped element, and whose other end is driven into a hole made in the base plate. In the example shown, each part is held by two pins driven into blind holes, but it is of course evident that the man skilled in the art may choose to install more or less pins as a function of the size of the parts to be shaped, or to make through holes to receive the pins.

Figure 1:
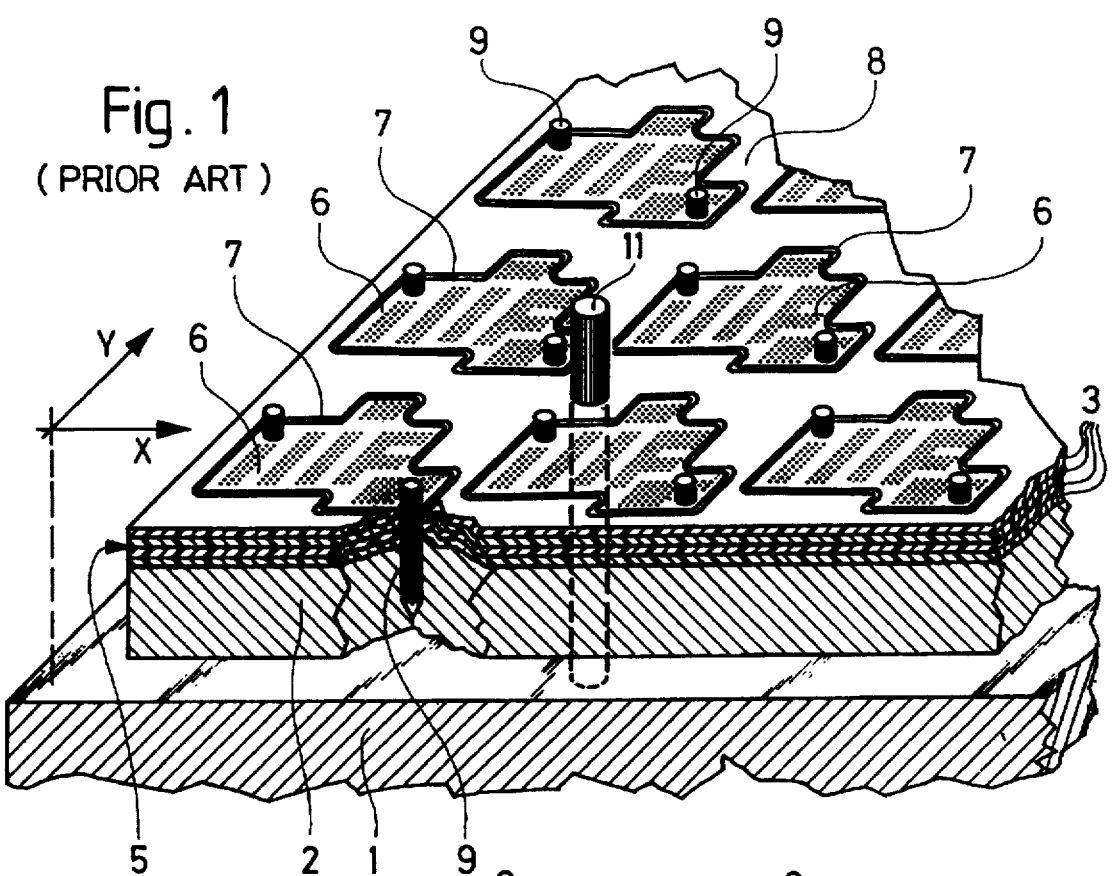
FIG. 1 is a partially cut away perspective view of a part of a stack of board shaped elements ready to be shaped in accordance with the prior art.

By comparison with the prior art shown in FIG. 1, it can be seen that single purpose base plate 4 fulfills the functions fulfilled by support plate 2 made in a durable material, such as Dellite® or aluminum, with a thickness very much greater than that of base plate 4 so as to be able to receive permanently the driven in pins and to be able to be manipulated during stocking operations without suffering deterioration.

FIG. 2 thus shows a step of the method just at the end of the shaping operation and before the separation of parts 6 from skeletons 8.

Referring now to FIGS. 3 to 7, the successive steps of the method according to the invention will be described.

In a first step (FIG. 3) a package formed by stack 5 of board shaped elements 3 and by base plate 4 is placed on table 1 of the machine tool (not shown) and fixed to the latter for example by through pins 11. In an advantageous manner, the package may be assembled before being installed on the table, for example by means of a perimetric adhesive strip or clips.

In a second step (FIG. 4) the drilling of holes 10 is carried out with a drill at positions provided inside each part for the subsequent pinning operation. The travel of the drilling tool is preferably adjusted so that holes 10 are blind in base plate 4. In certain cases, the holes may also be through holes, notably when the length of the pinning means can be adjusted with sufficient precision.

In a third step (FIG. 5) pins 9 are installed in holes 10, until they are flush with the outermost board shaped element.

According to an embodiment called "hard pinning", pins 9 are rigid in order to be driven into holes 10; they are made in a material which can be easily machined selected for example from among brass, wood or a plastic material. These pins may be provided either in a completely finished state or for finishing in situ, for example in the form of coils of wire cut to the right length after installation.

According to another embodiment, called "soft pinning", the pinning operation consists of injecting into holes 10 a quick setting synthetic resin preferably able to harden at room temperature. In this case, holes 10 will preferably be blind holes.

In both cases, it is preferable for the upper part of pins 9 not to pass beyond the surface of the outermost board shaped element. If this is necessary, the end of each pin may be ground down. It will be observed that in the prior art (see FIG. 1), by contrast, it was preferable for the end of the pins to pass beyond said surface.

In a fourth step (FIG. 6) one proceeds to the actual shaping operation by means of a milling cutter along contour 7 of each part 6.

In a fifth step (FIG. 7), one proceeds to the pin removing operation by boring pins 9 previously installed by means of a drill having a diameter equal to the initial diameter of holes 10, or slightly greater. It is also possible to use a drill having, either a diameter markedly greater, for example in the event that the holes formed would be useful for the subsequent attachment of the circuit onto a frame, or, on the contrary, a slightly smaller diameter for example in the event that one wished to keep a thin lining of the material which formed the pin on the wall of the formed hole. In the latter case, the board shaped elements or the printed circuits may also be separated from each other, for example by exerting a shearing movement.

Following this last step, parts 6 may be separated from skeletons 8.

Figure 8:
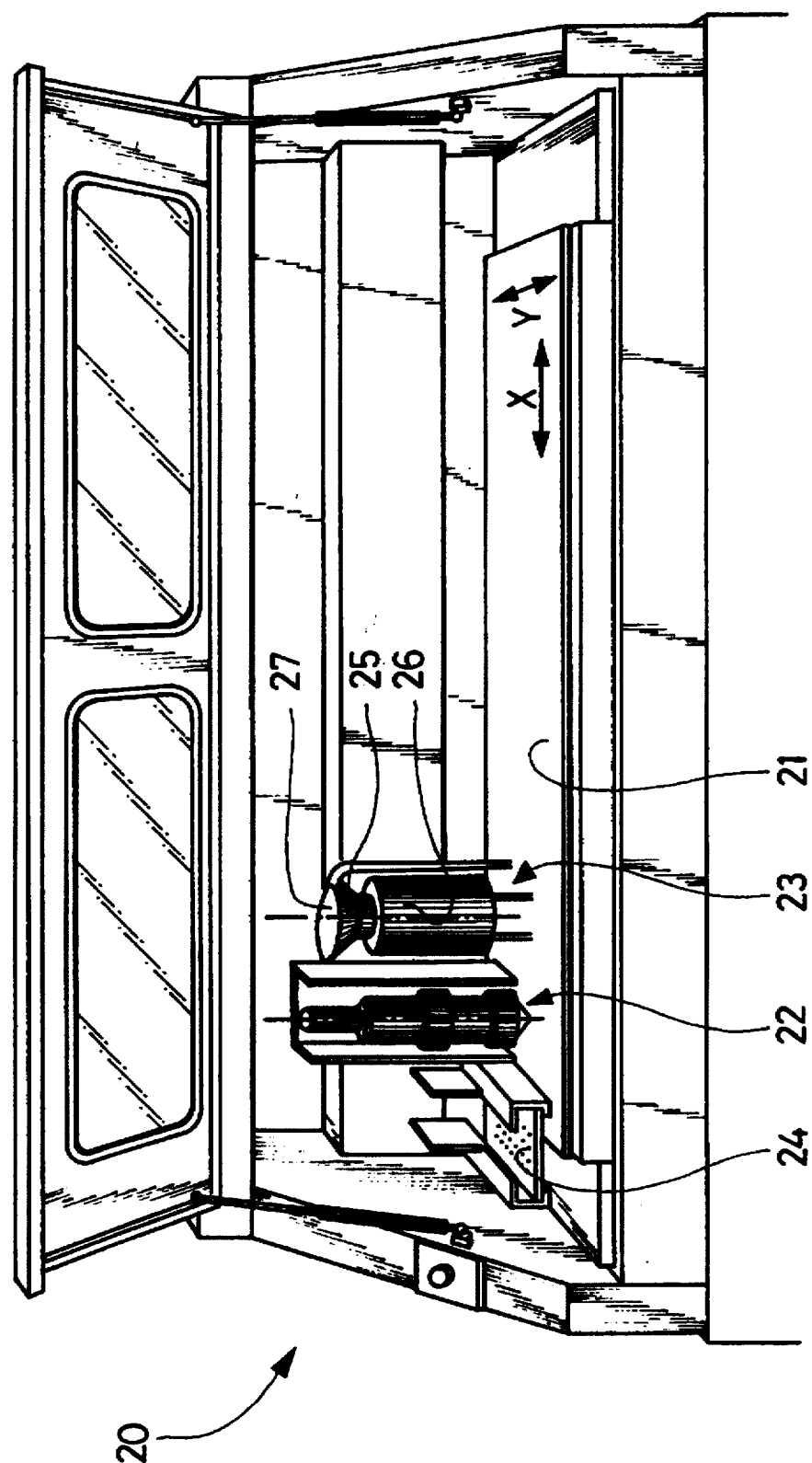
FIG. 8 is a perspective view of a machine tool notably enabling the method according to the invention to be implemented.

All the steps of the shaping method which have just been described are implemented by means of a machine tool shown schematically in FIG. 8. A machine tool of this type comprises a frame 20, at least one work-piece carrier 21, at least one operating unit 22 driving a rotatable cutting tool, means enabling relative displacement of work-piece carrier 21 of operating unit 22 along at least two axes, for example along the two axes X, Y of the table, characterized in that it includes in addition at least one pinning unit 23 arranged for installing or for forming pins through at least one board shaped element and the base plate fixed onto said work-piece carrier and means enabling relative displacement of the work-piece carrier and of the pinning unit in at least two directions. When the pins are formed by a quick setting synthetic resin, the pinning unit includes a device for injecting said resin used with means for supplying said resin.

When the pins are formed by a rigid material cut to the appropriate length the pinning unit includes a pinning head provided with a pin supply device 25 and a device 26 for driving in said pins. The supply device may be provided with a vibrating feed bowl 27. When the rigid pins are obtained from wire, the supply device includes a system for feeding and cutting the wire to the desired length.

In an advantageous manner, each operating unit may also be provided with an automatic tool loading device such as that disclosed in French patent FR 2 532 226 (corresponding to U.S. Pat. No. 4,520,551). This is particularly useful in the framework of the method according to the invention for which at least two cutting tools are necessary, one or two drills for drilling holes 10 (second and fifth steps) and a milling cutter for the shaping (fourth step).

FIG. 8 shows a single machining station but a same machine tool may include several work stations without departing from the framework of the invention.

In the entire preceding description, it has been supposed, by way of example, that the board shaped elements carried finished printed circuits, but without departing from the framework of the invention the man skilled in the art may adapt the method in order also to carry out, prior to the actual shaping operation of the board shaped element or a stack of said elements, shaping operations of said circuits, such as drilling.

What is claimed is:

1. A method for shaping parts in at least one board shaped element stacked on a table of a machine tool, each part having a contour, said method including the steps of:
   (a) providing a base plate having an upper face and a lower face,
   (b) installing on said upper face of the base plate at least one board shaped element comprising the parts to be shaped,
   (c) fixing said base plate and said board shaped element onto the table of the machine tool so that said lower face of the base plate comes into contact with said table,
   (d) drilling at least one hole through said board shaped element inside the contour of each part to be shaped, the holes extending substantially as far as the lower face of said base plate,
   (e) installing means forming a pin in each hole,
   (f) shaping said parts, and,
   (g) removing at least part of each of said pins by machining said pins.

2. A method according to claim 1, wherein step (d) comprises drilling blind holes.

3. A method according to claim 1 wherein step (e) comprises installing means forming pins that do not extend beyond an upper surface of said board shaped element.

4. A method according to claim 1 wherein step (e) comprises installing means forming pins including a rigid stem.

5. A method according to claim 1 wherein step (e) comprises installing in each hole a synthetic resin which hardens at room temperature.

6. A method according to claim 1 wherein step (g) consists of drilling the said pins.

7. A method according to claim 4 wherein, in step (e) said pins are formed from a soft material chosen from the group of soft materials consisting of brass, wood, and a quick setting synthetic resin.

8. A method according to claim 4 wherein the fixing of the board shaped element onto the base plate is achieved with the aid of at least one pin.

9. A method according to claim 1 wherein step (a) comprises providing as the base plate a single use board made of a rigid material chosen from the group of materials consisting of plywood and an agglomerate of resin and paper or wood.

10. A method for shaping parts in at least one board shaped element stacked on a table of a machine tool, each part having a contour, said method comprising the following steps in sequence:
   (a) providing a base plate having an upper face and a lower face,
   (b) forming a package by installing on said upper face of said base plate at least one board shaped element comprising the parts to be shaped,
   (c) fixing said package onto the table of the machine tool with said lower face of the base plate contacting said table,
   (d) drilling holes in said package, said holes extending through said board shaped element and into said base plate so as to provide at least one hole through said board shaped element within the contour of each part to be shaped, the holes extending substantially as far as the lower face of said base plate,
   (e) installing within each hole a pin means for fixedly holding a part to be shaped in position,
   (f) shaping said parts, and,
   (g) removing at least a part of each of said pin means by machining said pin means.

11. A method according to claim 10, wherein step (d) comprises drilling blind holes which do not extend entirely through said base plate.

12. A method according to claim 10 wherein step (e) comprises installing pin means having a rigid stem.

13. A method according to claim 10 wherein step (e) comprises installing in each hole a pin means comprising a synthetic resin which hardens at room temperature.

14. A method according to claim 10 wherein step (g) consists of drilling said pin means.

15. A method according to claim 12 wherein, in step (e) said pin means are formed from a soft material chosen from the group of soft materials consisting of brass, wood, and a quick setting synthetic resin.

16. A method according to claim 12 wherein step (c) comprises fixing the board shaped element and the base plate onto the table with at least one pin.

17. A method according to claim 10 wherein step (a) comprises providing as the base plate a single use board made of a rigid material chosen from the group of materials consisting of plywood and an agglomerate of resin and paper or wood.

* * * * *